United States Patent [19]

Ahmed

[11] 3,987,368

[45] Oct. 19, 1976

[54] EQUALIZATION OF BASE CURRENT FLOW IN TWO INTERCONNECTED TRANSISTOR AMPLIFIERS

[75] Inventor: Adel Abdel Aziz Ahmed, Annandale, N.J.

[73] Assignee: RCA Corporation, New York, N.Y.

[22] Filed: Feb. 19, 1976

[21] Appl. No.: 659,254

Related U.S. Application Data

[63] Continuation of Ser. No. 501,966, Aug. 30, 1974, abandoned.

[52] U.S. Cl. ............................... 330/30 D; 330/22; 330/69
[51] Int. Cl.² .......................................... H03F 3/68
[58] Field of Search .................. 330/13, 17, 22, 23, 330/30 D, 69

[56] References Cited
UNITED STATES PATENTS 3,745,477   7/1973   Freeborn ...................... 330/30 D X

OTHER PUBLICATIONS

Parmer, H. W. — "Two Easy Ways to Stabilize Power Transistor Hi-Fi Amplifiers" *Electronics* pp. 56–58, Oct. 1962.

*Primary Examiner*—Robert Segal
*Assistant Examiner*—Lawrence J. Dahl
*Attorney, Agent, or Firm*—H. Christoffersen; S. Cohen; K. Watov

[57] ABSTRACT

An input terminal of two differential amplifiers, one employing PNP transistors and the other NPN transistors having a different gain (beta) than the PNP transistors, connect in common to a terminal of a signal source. The operating currents to these amplifiers are maintained at different levels such that the base current flowing into the input terminal of one amplifier in its balanced condition is equal to that flowing from the input terminal of the other amplifier in its balanced condition.

21 Claims, 3 Drawing Figures

EQUALIZATION OF BASE CURRENT FLOW IN TWO INTERCONNECTED TRANSISTOR AMPLIFIERS

This is a continuation of application Ser. No. 501,966, filed Aug. 30, 1974, now abandoned.

Differential amplifiers, one or more of which employ NPN transistors and one or more of which employ PNP transistors, often are included in the same circuit, which may be an integrated circuit. Integrated circuit (IC) comparators, such as the CA 3099E, available commercially from RCA Corp. are examples of such circuits. It is common practice to employ lateral transistors for the PNP transistors and vertical transistors for the NPN transistors in integrated circuits.

Lateral IC transistors have much lower current gains than vertical IC transistors. Therefore, in a circuit where, for example, there are parallel signal paths, one via a differential amplifier employing PNP lateral transistors and the other via a differential amplifier employing NPN vertical transistors, the specifications for the PNP and NPN base switching or bias currents will differ and voltage to develop across the internal impedance of the input signal source, creating an error signal. Also, since the gm (transconductance) of a differential amplifier is directly proportional to its gain, and is proportional to the bias current applied to the joined emitters of its transistors, the gains of the NPN and PNP differential amplifiers will differ if their source currents are unequal.

In the circuits embodying present invention, operating current is supplied to the emitter-to-collector paths of two transistors of different gain in a fixed proportion such that under respective balanced conditions, the same base currents flow in these two transistors. In one form of the invention where the two base electrodes connect to a common input signal terminal, the current passing out of the base electrode of the PNP transistor is equal to that passing into the base electrode of the NPN transistor so that no quiescent base current flows to or from the signal terminal.

In the accompanying drawing, like reference numbers denote like components, and:

Reference is made to my U.S. Pat. No. 3,816,761 which describes, in detail, a comparator of the general type illustrated in FIG. 1 hereof (but without the biasing arrangement of the present application).

Figure 1:
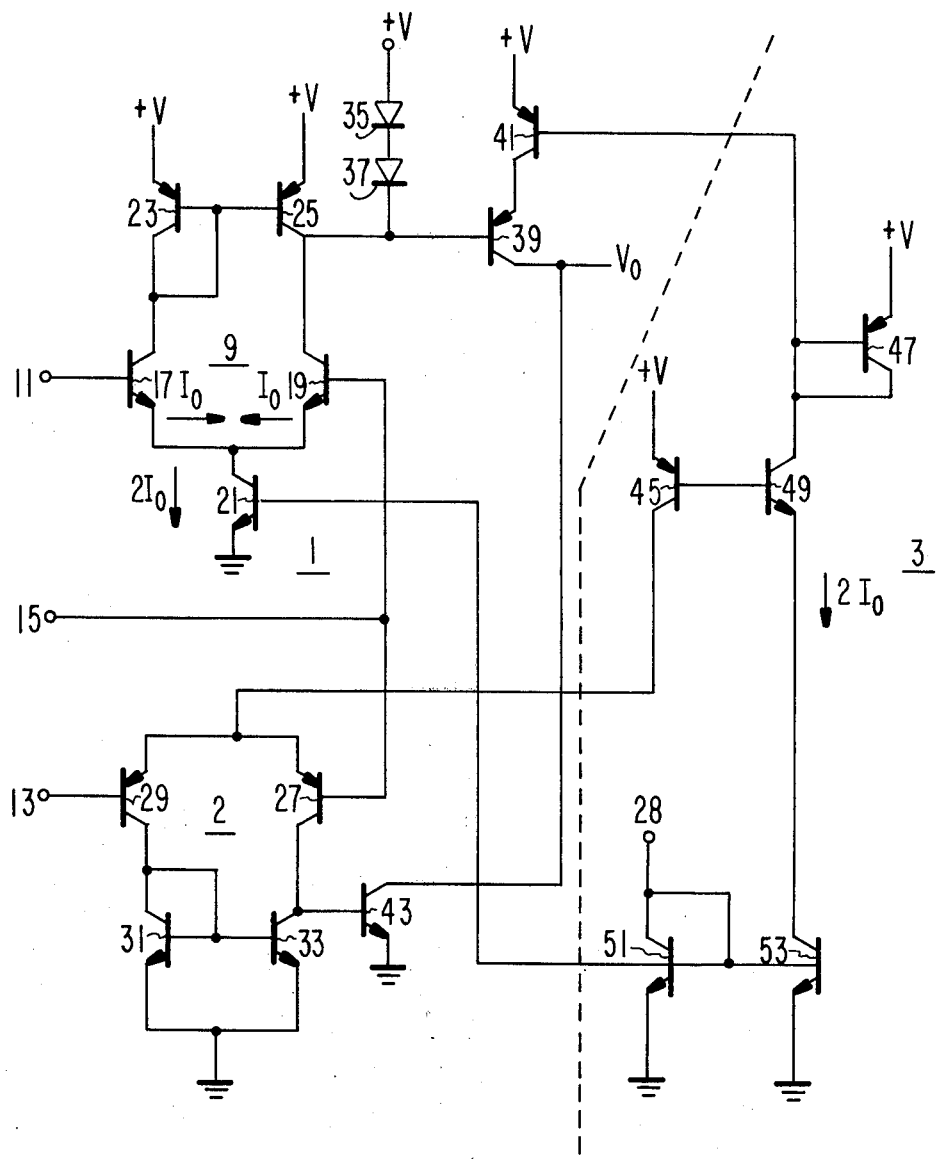
FIG. 1 is a schematic diagram of a comparator circuit embodying the invention.

The simplified voltage comparator 1 of FIG. 1 includes a differential amplifier 9, and a differential amplifier 2. Amplifier 9 includes NPN transistors 17 and 19 and this amplifier will be referred to as a "NPN differential amplifier"; amplifier 2 includes PNP transistors 27 and 29 and will be referred to as a "PNP differential amplifier". All PNP transistors are assumed to be lateral transistors; all NPN transistors are assumed to be vertical transistors. Amplifier 2 receives at its input terminal 13 a low reference voltage level; amplifier 9 receives at its input terminal 11 a high reference voltage level. Terminal 15 is the signal input terminal to which is applied the signal which is to be compared in value with the high and low reference voltages.

NPN differential amplifier 9 includes NPN transistors 17, 19 and 21 and PNP transistors 23 and 25. Transistor 23 is diode-connected with its base and collector electrodes connected to the base of transistor 25 and the collector of transistor 17, and its emitter electrode connected to a positive voltage source +V. Transistor 25 has its emitter connected to the voltage source +V, and its collector connected to the collector of transistor 29. The base of transistor 17 is connected to the high reference input terminal 11. The base of transistor 19 is connected both to signal input terminal 15, and to the base of PNP transistor 27 of the differential amplifier 2. The emitters of NPN transistors 17 and 19 are connected to the collector of transistor 21, whose base is connected through terminal 28 to a biasing circuit (not shown in FIG. 1).

PNP differential amplifier 2 includes PNP transistors 27 and 29, and NPN transistors 31 and 33. Transistor 31 is connected as a diode, that is, base to collector electrode. This common connection connects both to the collector of transistor 29 and to the base of transistor 33. The emitters of transistors 31 and 33 are connected to a point of reference potential, such as ground, and the collector of NPN transistor 33 is connected to the collector of transistor 27. The base of PNP transistor 29 is connected to the low-reference input terminal 13. The emitters of the transistors 27 and 29 are joined and connected to the current source 3.

In the amplifier 9, the operating currents of transistors 17 and 19 are determined by the collector current of the transistor 21. PNP Transistors 23 and 25 are connected in a current mirror configuration to provide active collector loads for the transistors 17 and 19, or to provide a current source.

In amplifier 2, the operating currents of the transistors 27 and 29 are determined by the current source 3. Transistors 31 and 33 are connected in a current mirror configuration to provide active collector loads acting as a current sink for the transistors 27 and 29.

Two diodes 35, 37 are connected in series between voltage source +V and the collector of transistor 19 to prevent saturation thereof.

Gain compensation of amplifier 9 is provided by a PNP transistor 39 having its base connected to the collector of transistor 19, and its collector connected to the voltage comparator output terminal $V_O$. A PNP current limiting transistor 41 is connected with its collector to the emitter of transistor 39, its base to the current source 3, and its emitter to the voltage source +V.

Gain compensation of amplifier 2 is improved by an NPN transistor 43, connected as a grounded emitter amplifier with its base connected to the collector of transistor 27, and its collector connected to the voltage comparator output terminal $V_O$.

The current source 3 includes PNP transistors 45 and 47, and NPN transistors 49, 51 and 53. Transistor 47 is diode-connected with its emitter connected to the voltage source +V, its collector and base connected to both the base of limiter transistor 41 and the collector of transistor 49. Transistor 49 has its base connected to the base of transistor 45, and its emitter connected to the collector of transistor 53. Transistor 53 has its emitter grounded and its base connected to terminal 28 for a current biasing means that is not shown in FIG. 1. Transistor 45 has its emitter connected to voltage source +V, and its collector connected to the joined emitters of transistors 27 and 29. Transistors 51 is diode connected, its base and collector being connected to bias terminal 28.

In the discussion which follows, a brief description is given of the operation of the voltage comparator 1, and a more detailed description is given of the base current equalization provided by current source 3.

When the signal applied to input terminal 15 is more positive than the high-reference level applied to terminal 11, the output $V_O$ of the comparator will be in one signal state. The output $V_O$ of the comparator will be in another signal state when the input signal applied to terminal 15 is less positive than the low-reference level to terminal 13. If the input signal applied has a value intermediate the low-reference input and the high-reference input, the output $V_O$ will be in an indeterminate or floating state with no current input to the output node of $V_O$.

Base current equalization of the differential amplifiers 9, 2 is achieved in the operating state of the comparator 1 when forward current is applied to terminal 28. Assuming that this current is $2I_O$, transistor 21 of amplifier 9 and transistor 53 of the current source 3 will each draw a collector current of $2I_O$, assuming that the gm's of transistors 51, 53 and 21 be matched. It is feasible to obtain such matching in the integrated circuit art.

With a current of magnitude $2I_O$ flowing through the collector of transistor 21, an emitter current of $I_O$ will flow from each of transistors 17 and 19 in the balanced state of this amplifier 9 (equal base inputs to transistors 17 and 19), assuming their geometries are the same and their current gains ($\beta_{17}$ and $\beta_{19}$) are equal. Assuming high betas, that is, $\beta+1$ approximately equal to $\beta$, the base currents ($I_{B17}$, $I_{B19}$) of transistors 17 and 19 will be:

$$I_{B17} = I_{B19} = \frac{+I_O}{\beta_{17}} = \frac{+I_O}{\beta_{19}} \quad (1)$$

In the current source 3, the emitter current of transistor 49 is $2I_O$; therefore, its base current $I_{B49}$ is $$I_{B49} = \frac{2I_O}{\beta_{49}} \quad (2)$$

This base current flows from the base of transistor 45, causing its collector current ($I_{C45}$) to have a magnitude of:

$$I_{C45} = \frac{+2I_O\beta_{45}}{\beta_{49}} \quad (3)$$

The collector current of the transistor 45 constitutes the operating source current for amplifier 2. Since the gain $\beta_{45}$ of PNP transistor 45 is lower than that of NPN transistor 49, the operating current flowing into the joined emitters of transistors 29 and 27 is less than $2I_O$ (see equation 3), that is, it is less than the current flowing from the joined emitters of transistors 17 and 19 of differential amplifier 9. When amplifier 2 is in the balanced condition, and assuming that the current gains of transistors 29 and 27 are equal, (as they are on a monolithic IC), these transistors will each have a base current ($I_{B29}$, $I_{B27}$) of:

$$I_{B29} = I_{B27} = \frac{-I_O\beta_{45}}{\beta_{27}\beta_{49}} = \frac{-I_O\beta_{45}}{\beta_{29}\beta_{49}} \quad (4)$$

To balanced base bias inputs currents of transistors 17, 19 to the balanced currents of transistors 27, 29, the beta current gain $\beta_{45}$ of the transistor 45 of the current source 3 is made equal to the current gains $\beta_{27}$ and $\beta_{29}$ of the transistors 27 and 29 so that:

$$I_{B29} = I_{B27} = \frac{-I_O}{\beta_{49}} \quad (5)$$

Also, the current gain $\beta_{49}$ of transistor 49 is made equal to the current gains $\beta_{17}$, $\beta_{19}$ of transistors 17 and 19, so that:

$$I_{B17} = -I_{B29} \quad (6)$$

Equation (6) is obtained by substituting $\beta_{49}$ for $\beta_{17}$ in equation (1) and noting the equality of the result to equation (5). Under these conditions then, $-I_{B29}=-I_{B27}=I_{B17}=I_{B19}$; that is, the base currents of the transistors 17, 19 for the balanced condition of amplifiers 9 are equal in magnitude, and opposite in polarity, to the base currents of the transistors 27, 29 for the balanced condition of amplifier 2. This results in equal but opposite polarity signal currents at the high and low comparison levels, respectively. Further, should terminals 11, 13 be connected in common, no base current will flow to or from the signal source (not shown) at balance since the base current of transistor 19 will cancel the base current of transistor 27.

Current limiting is provided in the output of the voltage comparator 1 by transistor 41. Limiting is obtained when the emitter of transistor 39 demands a current of magnitude greater than $2I_O$. Transistor 41 then comes out of saturation and begins to develop a collector-to-emitter voltage drop $V_{CE}$ to limit the current.

In order to maintain a balanced output between the amplifiers 9 and 2, gain compensation must be provided in their respective outputs. Gain imbalance occurs because the source current to amplifier 2 is different from that of amplifier 9. The $g_m$ (transconductance) of a differential amplifier is directly proportional to the magnitude of the source current supplied to the amplifier. In turn, the gain of the amplifier is directly proportional to $g_m$. Thus, if the operating source currents to the NPN and PNP differential amplifier 9, 2 were of such magnitude that the amplifiers 2, 9 had equal gains prior to adjusting for base input current equalization, then a drop in the operating source current to amplifier 2 would cause that amplifier's gain to decrease correspondingly. For this reason, gain compensation must be introduced to equalize the gains between the amplifiers 2 and 9, if the comparator 1 is to be balanced. As previously explained, gain compensation is provided for the amplifiers 9, 2 by transistor 39 and transistor 43, respectively. As an alternative to supplying a current less than $2I_O$ to the amplifier 2, operating current could be supplied to amplifier 9 and a current $2I_O$ to amplifier 2. This alternative is not as desirable as the one of FIG. 1 for the increased current may cause accuracy problems, decreased reliability due to greater heat generation, and so forth.

Figure 2:
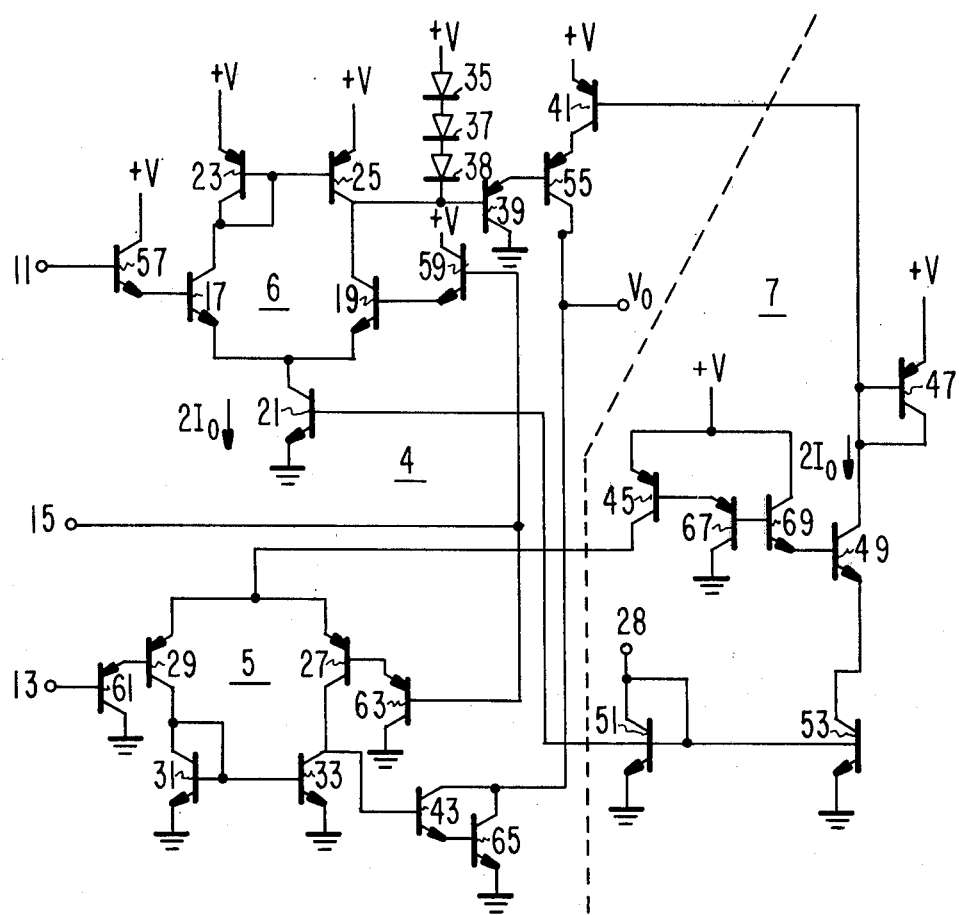
FIG. 2 is a schematic diagram of another form of comparator circuit embodying a form of the invention.

The NPN-PNP balanced base current equalization technique described above can also be used with a voltage comparator 4 having quasi Darlington configured NPN and PNP differential amplifiers 6 and 5 as shown in FIG. 2. The voltage comparator 4 is similar to the voltage comparator 1 shown in FIG. 1, the difference being the addition of NPN transistors 57 and 59 as common-collector amplifiers to form quasi Darlington configurations with NPN transistors 17 and 19, respectively; the addition of PNP transistors 61 and 63 as common-collector amplifiers to form quasi Darlington configurations with PNP transistors 29 and 27, respectively; the addition of PNP transistor 55 to PNP transistor 39 to form a Darlington configuration therewith; the addition of NPN transistor 65 to form a Darlington configuration with NPN transistor 43, and the addition of diode 38. Since the collectors of transistors 61, 63, 67 and 39 are connected to ground, vertical or lateral transistors may be used for these devices. In order to ensure equalization of the base currents of the Darlington configured PNP and NPN differential amplifiers 5, 6, the current source 3 of FIG. 1 must be modified to include transistor 67 and PNP transistor 69, as shown in FIG. 2. The emitter of transistor 45, and the collector of transistor 69 are connected to the voltage source +V. Transistors 67 is connected with its emitter to the base of transistor 45, its collector grounded, and its base to the base of transistor 69. Operation of the comparator circuit shown in FIG. 2, is essentially the same as that of FIG. 1.

The comparator circuit of FIG. 2 may be in integrated or discrete circuit form. Equalization of the base input currents of the NPN and PNP differential amplifiers 6, 5, will now be explained. NPN transistor 21 of the NPN differential amplifier 6 is biased to permit an operating source current of $2I_O$ to flow through the joined emitters of NPN transistors 17 and 19. As a result, the base current $I_{B59}$ flowing into NPN transistor 59 will have the following magnitude, assuming high betas such that $\beta+1$ is equal approximately to $\beta$:

$$I_{B59} = \frac{I_0}{\beta_{19}\beta_{59}} \quad (7)$$

where $\beta_{19}$ is the beta current gain of NPN transistor 19, and $\beta_{59}$ is the beta current gain of NPN transistor 59. If the amplifier 6 is itself balanced, then the current gains $\beta_{57}$, $\beta_{17}$ of NPN transistors 57 and 17 will be equal to $\beta_{59}$ and $\beta_{19}$, respectively. Therefore, the base input current $I_{B57}$ of transistor 57 will be equal to $I_{B59}$.

Transistor 53 of the current source 7 is biased to draw an operating collector current of magnitude $2I_O$. If the beta current gain of transistor 49 is $\beta_{49}$, then a base current $I_{B49}$ of the following magnitude will flow into its base:

$$I_{B49} = \frac{2I_0}{\beta_{49}} \quad (8)$$

As a result, the base current $I_{B69}$ of NPN transistor 69 will have a magnitude of:

$$I_{B69} = \frac{2I_0}{\beta_{49}\beta_{69}} \quad (9)$$

where $\beta_{69}$ is the current gain of NPN transistor 69. The emitter current $I_{e67}$ of PNP transistor 67, is therefore:

$$I_{e67} = \frac{2I_0\beta_{67}}{\beta_{49}\beta_{69}} \quad (10)$$

where $\beta_{67}$ is its current gain. Correspondingly, the collector current $I_{c45}$ of PNP transistor 45 will be:

$$I_{c45} = \frac{2I_0\beta_{67}\beta_{45}}{\beta_{49}\beta_{69}} \quad (11)$$

where $\beta_{45}$ is its beta current gain. The source current supplied to differential amplifier 5 will be $I_{c45}$. In order to equalize the balanced base input currents of amplifier 5 to those of amplifier 6, it is necessary that the following beta current gain relations exist:

$$\beta_{49} = \beta_{19} = \beta_{17} \quad (12)$$

$$\beta_{69} = \beta_{59} = \beta_{57} \quad (13)$$

$$\beta_{67} = \beta_{63} = \beta_{61} \quad (14)$$

$$\beta_{45} = \beta_{29} = \beta_{27} \quad (15)$$

If such current gain relations exist, then:

$$I_{c45} = \frac{2I_0\beta_{63}\beta_{27}}{\beta_{19}\beta_{59}}, \quad (16)$$

and the base current $I_{B63}$ of PNP transistor 63 will be:

$$I_{B63} = \frac{-I_0}{\beta_{19}\beta_{59}} = -(I_{B59}). \quad (17)$$

Accordingly, the respective base input currents for the balanced conditions of the NPN and PNP differential amplifiers 6,5 respectively will be equal and opposite. This results in equal and opposite polarity signal currents at the high and low comparison levels, respectively. Further, should terminals 11 and 13 be connected in common, no current will flow to or from the signal source when the input signal has the same value as the voltage at terminals 11 and 13, since the base currents of transistors 59 and 63 will cancel one another.

Figure 3:
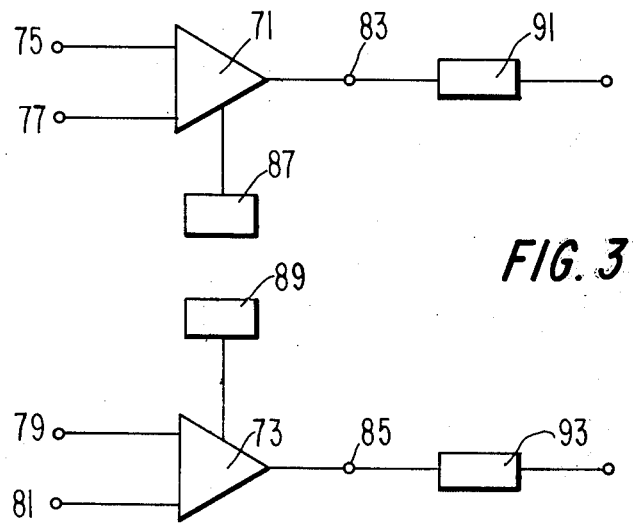
FIG. 3 is a block diagram of a third embodiment of the invention.

FIG. 3 illustrates an embodiment of the present invention in which the first and second differential amplifiers 71 and 73, can have the same or opposite conductivity transistors. If it is desired to merely equalize the magnitudes of the base bias currents flowing through the base input terminals 75 and 77 of the first differential amplifier 71, at balance to the base bias currents flowing through the base input terminals 79 and 81 of the second differential amplifier 73, at balance these terminals do not have to be interconnected in any manner for the invention to be operative. Nor does the output 83 of the first differential amplifier 71 have to be interconnected in any manner to the output 85 of the second differential amplifier 73. A circuit of this kind can be employed for example, for sensing the output current of a bridge of the type used to measure heat, smoke, strain and so on, where the bridge may include transducers such as thermistors, ionization chambers, strain gauge wires and so on. In such application, loading of the source by the amplifier input currents can be kept symmetrical so that equal errors result when loaded by either amplifier.

In the embodiment of FIG. 3, a first current source 87 supplies an operating current of a given magnitude to the first differential amplifier 71, and a second current source 89 supplies an operating current to the second differential amplifier 73, having a magnitude equal to the operating current of the first current source 87 times the ratio of the beta current gain of the second differential amplifier 73 to the beta current gain of the first differential amplifier 71. With these currents established at these ratios, the base bias input currents of the amplifiers 71 and 73 at balance will be equal in magnitude.

If it is desired to equalize the gain of the amplifiers 71 and 73, gain composition can be provided by the addition of an amplifier 91 at the output 83 of the first differential amplifier 71, and the addition of another amplifier 93 at the output 85 of the second differential amplifier 73. The configuration of the gain compensation amplifiers 91, 93 is determined by the configuration of their respective differential amplifiers 71 and 73.

What is claimed is:

1. A method for substantially reducing loading of a signal source connected in common to two base electrodes, one such electrode at an input terminal of an NPN differential amplifier and the other at an input terminal of a PNP differential amplifier having a lower beta gain than said NPN differential amplifier, said NPN and PNP differential amplifiers being fabricated from integrated circuit vertical and lateral transistors, respectively, comprising the steps of:
  supplying an operating current to the NPN differential amplifier of a magnitude to cause a quiescent base current of a given value to flow into said input terminal of said NPN differential amplifier; and
  supplying an operating current to the PNP differential amplifier in the same proportional to the operating current supplied to said NPN differential amplifier as the beta of said lateral transistors is to the beta of said vertical transistors, and of a magnitude to cause a quiescent base current of said given value to flow out of said input terminal of said PNP differential amplifier.

2. A method for establishing a base current flow into the base electrode at an input terminal of an NPN differential amplifier, when in a substantially balanced condition, at a level equal to the current flow out of the base electrode at the input terminal of a PNP differential amplifier, when in a substantially balanced condition, said NPN amplifier including NPN transistors having commonly connected emitters, and said PNP amplifier including PNP transistors having commonly connected emitters, comprising the steps of:
  supplying a first operating current to the common emitters of the NPN differential amplifier of a magnitude to produce a base current flow of given value into said input terminal of said NPN differential amplifier; and
  supplying a second operating current to the common emitters of the PNP differential amplifier of a magnitude equal to the product of the first current magnitude times the ratio of the beta current gain of the transistors of the PNP differential amplifier to the beta current gain of the NPN transistors of the NPN differential amplifier, whereby a base current of said given value flows out of said input terminals of said PNP differential amplifier.

3. In a circuit which employs first and second transistors, one NPN, the other PNP and of different $\beta$ gains, each connected at its base electrode to a common terminal for a signal source, where each transistor has a collector-to-emitter path, a circuit for making the base current flow of one transistor equal to that of the other transistor at a given level of input signal to each transistor, comprising, in combination:
  means for supplying an operating current $I_0$ to the collector-to-emitter path of said first transistor for producing a base current flow $$I_{B1} = \frac{I_0}{\beta_1},$$

where $\beta_1$ is the gain of the first transistor; and
  means for supplying an operating current $$I_2 = \frac{I_0 2}{\beta_1}$$

to the collector-to-emitter path of said second transistor, where $\beta_2$ is the gain of the second transistor.

4. In a circuit which includes:
  a first differential amplifier having two PNP transistors, each having base, emitter and collector electrodes, and connected emitter electrode-to-emitter electrode; a second differential amplifier having two NPN transistors of different gain than the PNP transistors, each NPN transistor having base, emitter and collector electrodes and where said emitter electrodes of said NPN transistors are connected to one another; and a signal input terminal connected in common to the base electrode of one PNP transistor and the base electrode of one NPN transistor; the improvement comprising;
  means coupled between the connected emitter electrodes of the NPN transistors and the collector electrodes of these transistors for supplying an operating current of one value to said transistors to thereby cause a first quiescent base current to flow from said signal input terminal to the NPN transistor connected to said signal input terminal; and
  means coupled between the connected emitter electrodes of the PNP transistors and the collector electrodes of these transistors for supplying an operating current of a value to said PNP transistors such that a second quiescent base current, which remains equal to said first quiescent base current, flows from the PNP transistor connected to said signal input terminal, to said signal input terminal, independently of variations in the betas of said PNP and NPN transistors.

5. In a circuit which employs first and second transistors of different $\beta$ gain, each having a base electrode and a collector-to-emitter path, a circuit for equalizing the base current flow in said two transistors for substantially equivalent signal conditions at their base electrodes, respectively, comprising, in combination:
  means for supplying an operating current $I_0$ to the collector-to-emitter path of said first transistor for producing a base current flow $$I_{B1} = \frac{I_0}{\beta_1},$$

where $\beta_1$ is the gain of the first transistor; and
  means for supplying an operating current $$I_2 = \frac{I_0 2}{\beta_1}$$

to the collector-to-emitter path of said second transistor, where $\beta_2$ is the gain of the second transistor.

6. The circuit of claim 3, wherein said means for said supplying an operating current $$I_2 = \frac{I_o 2}{\beta_1}$$

to the collector-to-emitter path of said second transistor, where $\beta_2$ is the gain of the second transistor, where said first transistor is an NPN transistor, and said second transistor a PNP transistor, includes:
  an NPN transistorized current mirror having an input terminal receptive of a bias current, an output terminal and a common terminal connected to a point of reference potential;
  a positive voltage supply;
  a third transistor being an NPN transistor matched to and having the same $\beta_1$ value of gain as said first transistor, and having a collector electrode coupled to said voltage supply, an emitter electrode connected to the output terminal of said current mirror, and a base electrode, said current mirror being biased to supply an output current of magnitude $I_o$; and
  a fourth transistor being a PNP transistor matched to and having the same $\beta_2$ value of gain as said second transistor, and having a base electrode connected to the base electrode of said third transistor, an emitter electrode connected to said voltage supply, and a collector electrode connected to the emitter electrode of said second transistor.

7. The circuit of claim 3, wherein said means for supplying an operating current $$I_2 = \frac{I_o 2}{\beta_1}$$

to the collector-to-emitter path of said second transistor, being a PNP transistor includes:
  a third transistor being an NPN transistor matched to said one NPN transistor, having a gain of $\beta_1$, a collector-to-emitter path, and a base electrode;
  a positive voltage supply;
  a fourth transistor being a PNP transistor matched to said other PNP transistor, having a gain of $\beta_2$, an emitter electrode connected to said voltage supply, and a collector electrode connected to the emitter electrode of said other PNP transistor; and
  means for supplying an operating current having a magnitude $I_o$ to the collector-to-emitter path of said third transistor.

8. A method for substantially equalizing the flow of signal currents from and to a signal source connected in common to two base electrodes, one such electrode at an input terminal of an NPN differential amplifier and the other at an input terminal of a PNP differential amplifier having a different beta gain than said NPN differential amplifier, comprising the steps of:
  supplying an operating current to the NPN differential amplifier of a magnitude to cause a base current of a given value to flow into said input terminal of said NPN differential amplifier when in a substantially balanced condition; and
  supplying an operating current to the PNP differential amplifier in the same proportion to the operating current supplied to said NPN differential amplifier as the beta of said lateral transistors is to the beta of said vertical transistors, and of a magnitude to cause a base current of said give value to flow out of said input terminal of said PNP differential amplifier when the latter is in a substantially balanced condition.

9. The method of claim 8, further including the steps of:
  amplifying the output signal produced by said NPN differential amplifier by a first amount to provide a first overall gain of the signal supplied by said signal source to said NPN differential amplifier; and
  amplifying the output signal produced by said PNP differential amplifier by a second amount to provide a second overall gain for the signal supplied by said signal source to said PNP differential amplifier, the ratio of the first and second amounts being chosen to provide a ratio between the first and second overall gains equal to 1.

10. The method of claim 2, further comprising the step of compensating for the variance from 1 of the ratio of the transconductance gain $g_{m1}$ of said NPN differential amplifier and the transconductance gain $g_{m2}$ of said PNP differential amplifier caused by the difference in magnitudes of the operating currents supplied to said amplifiers, including the steps of:
  amplifying an output signal of said NPN differential amplifier by an amount $A_1$ to provide an overall gain $G_1$ for a signal supplied to the NPN differential amplifier; and
  amplifying an output signal of said PNP differential amplifier by an amount $A_2$ to provide an overall gain $G_2$ for a signal supplied to the NPN differential amplifier, where $A_1$ and $A_2$ are chosen so that $G_1 = G_2$.

11. The circuit of claim 3, wherein said means for supplying an operating current $$I_2 = \frac{I_o 2}{\beta_1}$$

to the collector-to-emitter path of said second transistor, where $\beta_2$ is the gain of the second transistor, where said first transistor is an NPN transistor, and said second transistor a PNP transistor, includes:
  an NPN transistorized current mirror having an input terminal receptive of a bias current, an output terminal and a common terminal connected to a point of reference potential;
  a positive voltage supply;
  a third transistor being an NPN transistor matched to and having the same $\beta_1$ value of gain as said first transistor, and having a collector electrode coupled to said voltage supply, an emitter electrode connected to the output terminal of said current mirror, and a base electrode, said current mirror being biased to supply an output current of mganitude $I_o$; and
  a forth transistor being a PNP transistor matched to and having the same $\beta_2$ value of gain as said second transistor, and having a base electrode connected to the base electrode of said third transistor, and emitter electrode connected to said voltage supply, and a collector electrode connected to the emitter of said second transistor.

12. The circuit of claim 3, wherein said means for supplying an operating current $$I_2 = \frac{I_0 2}{\beta_1}$$

to the collector-to-emitter path of said second transistor, being a PNP transistor includes:
- a third transistor being an NPN transistor matched to said one NPN transistor, having a gain of $\beta_1$, a collector-to-emitter path, and a base electrode;
- a positive voltage supply;
- a fourth transistor being a PNP transistor matched to said other PNP transistor, having a gain of $\beta_2$, an emitter electrode connected to said voltage supply, and a collector electrode connected to the emitter electrode of said other PNP transistor; and
- means for supplying an operating current having a magnitude $I_0$ to the collector-to-emitter path of said third transistor.

13. In a circuit which includes:
- a first differential amplifier having two PNP transistors each having a base, emitter and collector electrodes, and connected emitter electrode-to-emitter electrode; a second differential amplifier having two NPN transistors of different gain than the PNP transistors, each NPN transistor having base, emitter and collector electrodes and where said emitter electrodes of said NPN transistors are connected to one another; and a signal input terminal connected in common to the base electrode of one PNP transistor and the base electrode of one NPN transistor; the improving comprising:
- means coupled between the connected emitter electrodes of the NPN transistors and the collector electrodes of these transistors for supplying an operating current of one value to said transistors for causing a first base current to flow from said signal input terminal to the NPN transistor connected to said signal input terminal, when said second differential amplifier is in the balanced condition; and
- means coupled between the connected emitter electrodes of the PNP transistors and the collector electrodes of these transistors for supplying an operating current of a value to said PNP transistors such that a second base current equal to said first base current, flows from the PNP transistor connected to said signal input terminal, to said signal input terminal, independently of differences between the betas of said PNP and NPN transistors, when said first differential amplifier is in its balanced condition.

14. In the circuit as set forth in claim 13, further including:
- means for individually amplifying an output signal from each one of said first and second differential amplifiers, so that the resultant ratio of the overall gains of said amplifiers is equal to 1.

15. In the circuit as set forth in claim 14, wherein said amplifying means, said first and second differential amplifiers, said current supply means for said NPN transistors, and said current supply means for said PNP transistors, are all fabricated on the same integrated circuit wafer.

16. A circuit comprising a first differential amplifier having first and third transistors of one conductivity type each having a common emitter forward current gain $\beta_1$, and each having a base electrode, a collector electrode, and an emitter electrode; a second differential amplifier having second and fourth transistors of the opposite conductivity type each having a common emitter forward current gain $\beta_2 \neq \beta_1$, and each having a base electrode, a collector electrode, and an emitter electrode; the base electrodes of the first and second transistors being connected to a common input signal terminal; a first source of substantially constant current of magnitude $I_1$ connected in common to the emitter electrodes of the first and third transistors; and a second source of substantially constant current $$I_2 = \frac{I_1 \beta_2}{\beta_1}$$

connected in common to the emitter electrodes of the second and fourth transistors, whereby the base current which flows in the first transistor, when the first differential amplifier is in balance, has the same magnitude as the base current that flows in the second transistor, when the second differential amplifier is in balance.

17. The circuit of claim 16, wherein said second source of substantially constant current comprises a fifth transistor of said one conductivity type having a common emitter forward current gain $\beta_1$, a collector-emitter path and a base electrode; a sixth transistor of said opposite conductivity type having a common emitter forward current gain $\beta_2$, a base electrode direct current conductively connected to the base electrode of said fifth transistor, and a collector-emitter path connected between a point of fixed potential and the emitter electrode of said second transistor; and means for supplying a current $I_1$ to the collector-emitter path of said fifth transistor.

18. The circuit of claim 16, wherein said first source of substantially constant current $I_1$ comprises a current mirror amplifier having an input terminal and first and second output terminals, said first output terminal being connected to the emitter of said first transistor; and wherein said second source of substantially constant current $I_2$ includes a fifth transistor of said one conductivity type having a common emitter forward current gain $\beta_1$, having an emitter electrode connected to the second output terminal of said current mirror and having also a base electrode, a sixth transistor of said opposite conductivity type connected in the common emitter configuration, having a common emitter forward current gain $\beta_2$, having a base electrode direct current connected to the base electrode of said fifth transistor, and having a collector electrode connected to the emitter of said second transistor.

19. The circuit of claim 16 further comprising means for compensating for the difference in overall gain between said first and second differential amplifiers caused substantially by the difference in the magnitudes of operating current supplied by said first and second sources, respectively, said compensating means including:
- means for amplifying an output signal of said first amplifier to provide a first overall gain; and
- means for amplifying an output signal of said second amplifier to provide a second overall gain, such that the ratio of said first to said second overall gains of said first and second amplifiers, respectively is equal to 1.

20. The circuit of claim 19, wherein said means for amplifying an output signal of said first amplifier includes a fifth transistor of like conductivity to said first transistor, and having a base electrode connected to the collector electrode of said first transistor, a collector electrode at which the amplified output signal of said first amplifier is developed, and an emitter electrode coupled to a first voltage; and said means for amplifying an output signal of said second amplifier includes a sixth transistor of like conductivity to said second transistor, and having a base electrode connected to the collector electrode of said second transistor, an emitter electrode connected to a point of reference potential, and a collector electrode at which the amplified output signal of said second amplifier is developed.

21. The circuit of claim 20, wherein the beta current gains of said fifth and sixth transistors are matched.

* * * * *

UNITED STATES PATENT OFFICE
CERTIFICATE OF CORRECTION

PATENT NO. : 3,987,368
DATED : October 19, 1976
INVENTOR(S) : Adel Abdel Aziz Ahmed It is certified that error appears in the above-identified patent and that said Letters Patent are hereby corrected as shown below:

Column 1, line 23, after "and" insert -- may also cause an offset --.

Column 2, line 9, change "29" to -- 19 --.
Column 2, line 24, delete "NPN".
Column 2, line 30, after "In" delete "the".
Column 2, line 32, delete "PNP".
Column 2, line 39, after "collector" insert -- current --.
Column 2, line 52, after "is" change "improved" to -- provided --.
Column 4, line 4, after "To" insert -- equalize the --.
Column 4, line 6, after "balanced" insert -- base --.
Column 4, line 24, "amplifiers" should be -- amplifier --.
Column 4, line 61, after "amplifier 2," insert -- a greater magnitude of --.
Column 5, line 20, delete "PNP".
Column 5, line 23, "Transistors" should be -- Transistor --.
Column 5, line 57, equation 8, should read $$-- \quad I_{B49} = \frac{2I_0}{\beta_{49}} \quad --$$

Column 7, line 35, "proportional" should be -- proportion --.
Column 7, line 65, "terminals" should be -- terminal --.
Column 8, line 17, should read $$-- \quad I_2 = \frac{I_0 \beta_2}{\beta_1} \quad --$$

Column 8, line 67, should read $$-- \quad I_2 = \frac{I_0 \beta_2}{\beta_1} \quad --$$

UNITED STATES PATENT OFFICE
CERTIFICATE OF CORRECTION

PATENT NO. : 3,987,368
DATED : October 19, 1976
INVENTOR(S) : Adel Abdel Aziz Ahmed It is certified that error appears in the above-identified patent and that said Letters Patent are hereby corrected as shown below:

Column 9, line 3, after "for" delete -- said --.
Column 9, line 7, should read $$-- I_2 = \frac{I_0 \beta_2}{\beta_1} --$$

Column 9, line 39, should read $$-- I_2 = \frac{I_0 \beta_2}{\beta_1} --$$

Column 10, line 6, "give" should be -- given --.
Column 10, line 44, should read $$-- I_2 = \frac{I_0 \beta_2}{\beta_1} --$$

Column 10, line 62, "mganitude" should be -- magnitude --.
Column 11, line 6, should read $$-- I_2 = \frac{I_0 \beta_2}{\beta_1} --$$

Column 11, line 35, "improving" should be -- improvement --.

Signed and Sealed this

Twenty-second Day of March 1977

[SEAL]

Attest:

RUTH C. MASON
*Attesting Officer*

C. MARSHALL DANN
*Commissioner of Patents and Trademarks*

Disclaimer 3,987,368.—*Adel Abdel Aziz Ahmed*, Annandale, N.J. EQUALIZATION OF BASE CURRENT FLOW IN TWO INTERCONNECTED TRANSISTOR AMPLIFIERS. Patent dated Oct. 19, 1976. Disclaimer filed Mar. 15, 1978, by the assignee, *RCA Corporation*.

Hereby enters this disclaimer to claims 1, 2, 3, 4, 5, 8, 13 and 16 of said patent.

[*Official Gazette May 16, 1978.*]